United States Patent
Park et al.

[11] Patent Number: 5,879,999
[45] Date of Patent: Mar. 9, 1999

[54] METHOD OF MANUFACTURING AN INSULATED GATE SEMICONDUCTOR DEVICE HAVING A SPACER EXTENSION

[75] Inventors: Heemyong Park, Gilbert; Vida Ilderem, Phoenix; Robert B. Davies, Tempe, all of Ariz.

[73] Assignee: Motorola, Inc., Schaumburg, Ill.

[21] Appl. No.: 720,510

[22] Filed: Sep. 30, 1996

[51] Int. Cl.[6] ................................. H01L 21/336
[52] U.S. Cl. ..................... 438/304; 438/267; 438/286
[58] Field of Search ................... 438/267, 266, 438/277, 286, 303, 304

[56] References Cited

U.S. PATENT DOCUMENTS

| | | | |
|---|---|---|---|
| 4,312,680 | 1/1982 | Hsu | 438/286 |
| 4,419,809 | 12/1983 | Riseman et al. | 438/286 |
| 4,597,827 | 7/1986 | Nishitani et al. | 438/286 |
| 4,994,904 | 2/1991 | Nakagawa et al. | |
| 5,091,763 | 2/1992 | Sanchez | 438/304 |
| 5,108,939 | 4/1992 | Manley et al. | |
| 5,256,586 | 10/1993 | Choi et al. | 438/304 |
| 5,286,664 | 2/1994 | Hiriuchi | 438/286 |
| 5,541,132 | 7/1996 | Davies et al. | |
| 5,661,048 | 8/1997 | Davies et al. | 438/303 |

*Primary Examiner*—Tuan H. Nguyen
*Attorney, Agent, or Firm*—Kevin B. Jackson

[57] ABSTRACT

An insulated gate semiconductor device (10) having a gate structure (45) that includes a conductive spacer (32) and an extension region (46) extending from the conductive spacer (32). To form the gate structure (45), a stack having sidewalls (22) is formed over a major surface (12) of a semiconductor substrate (11). A gate dielectric (23) is then formed over the major surface (12) adjacent to the sidewalls (22). The conductive spacer (32) is formed on the gate dielectric (23). The extension region (46) is then formed using selective growth or deposition and patterning of polysilicon adjacent the conductive spacer (32).

15 Claims, 11 Drawing Sheets

METHOD OF MANUFACTURING AN INSULATED GATE SEMICONDUCTOR DEVICE HAVING A SPACER EXTENSION

BACKGROUND OF THE INVENTION

This invention relates, in general, to semiconductor processing and more particularly, to methods for forming semiconductor devices having features with sub-photolithographic dimensions.

Semiconductor devices such as insulated gate field effect transistor (IGFET) devices are becoming increasingly important in low voltage applications. As IGFET devices are scaled to smaller and smaller dimensions, manufacturers must refine transistor designs to maintain optimum device performance. Typically, in IGFET devices having channel lengths in the sub-micron range, manufacturers must carefully fabricate drain regions to avoid performance degradation problems such as hot carrier injection, drain leakage, punch-through, and the like.

Semiconductor manufacturers correct many device performance problems by forming a lightly-doped-drain (LDD) region. The LDD region acts to lower the electric field in the channel region near the drain region. This reduced electric field improves threshold voltage stability by reducing hot carrier injection into the gate oxide layer overlying the channel region. In another approach, manufacturers place a higher doped region in the channel region between the source and drain region and extending from the surface down into the bulk semiconductor material. This higher doped region is of the same conductivity type as the channel region and functions to reduce punch-through.

With the ever increasing demand for higher performance devices, cost effective and flexible methods and structures are needed that allow manufacturers to incorporate performance enhancing features such as those set forth above. It would be advantageous for such structures and methods to support mixed-mode (integrated analog/digital) circuit designs as well as low and high power applications.

DETAILED DESCRIPTION OF THE DRAWINGS

Figure 1:
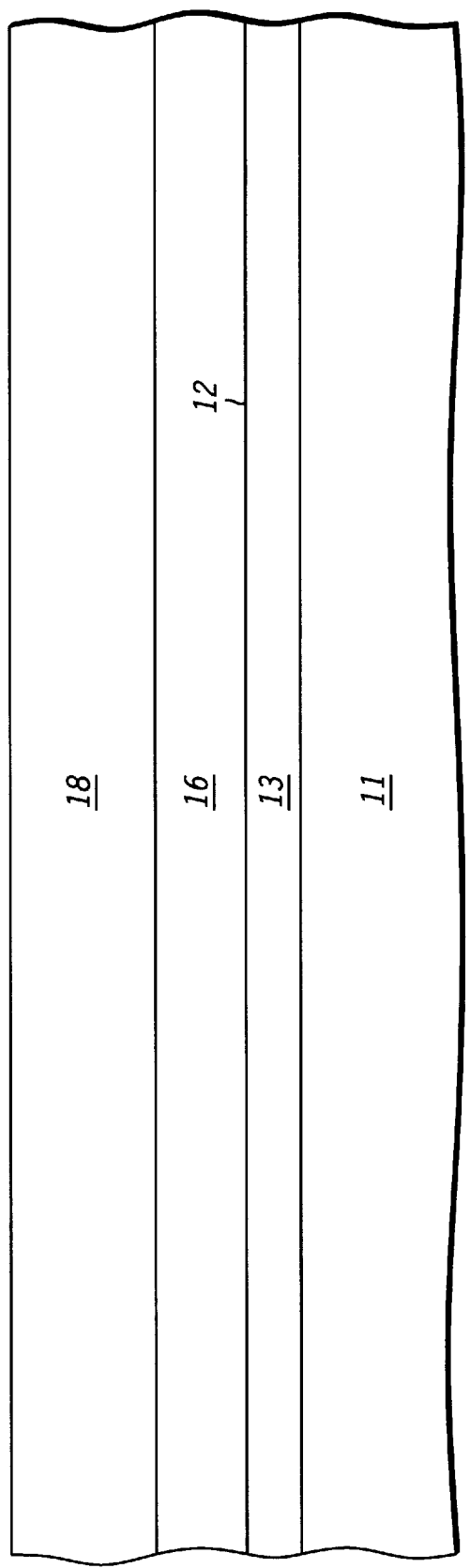
FIGS. 1–5 illustrate cross-sectional views of a semiconductor structure during manufacture in accordance with the present invention.

FIG. 1 illustrates an enlarged cross-sectional view of a semiconductor structure 10, which is a portion of a partially completed field effect transistor during processing in accordance with an embodiment of the present invention. FIG. 1 shows a semiconductor substrate or a body of semiconductor material 11 having a major surface 12 and a doped layer 13 extending from major surface 12 into substrate 11. By way of example, for an N-channel field effect transistor, semiconductor substrate 11 is silicon of P type conductivity, and doped layer 13 is of N type conductivity having a dopant concentration ranging from approximately $5\times10^{15}$ atoms per cubic centimeter (atoms/cm$^3$) to $2\times10^{17}$ atoms/cm$^3$. Doped layer 13 is an optional layer that serves as a drain extension region. Techniques for forming drain extension regions are well known to those skilled in the art.

A layer 16 of dielectric material is formed on major surface 12. Suitable techniques for forming layer 16 include thermal oxidation, chemical vapor deposition, and the like. Preferably, layer 16 is formed using thermal oxidation. By way of example, layer 16 has a thickness ranging between approximately 10 nanometers (nm) and approximately 200 nm. The thickness of layer 16 sets the gate-to-drain capacitance ($C_{gd}$) of a field effect transistor formed from semiconductor structure 10. A layer 18 of dielectric material is formed on layer 16. By way of example, layer 18 is a nitride layer having a thickness ranging between approximately 50 nm and approximately 300 nm.

Figure 2:
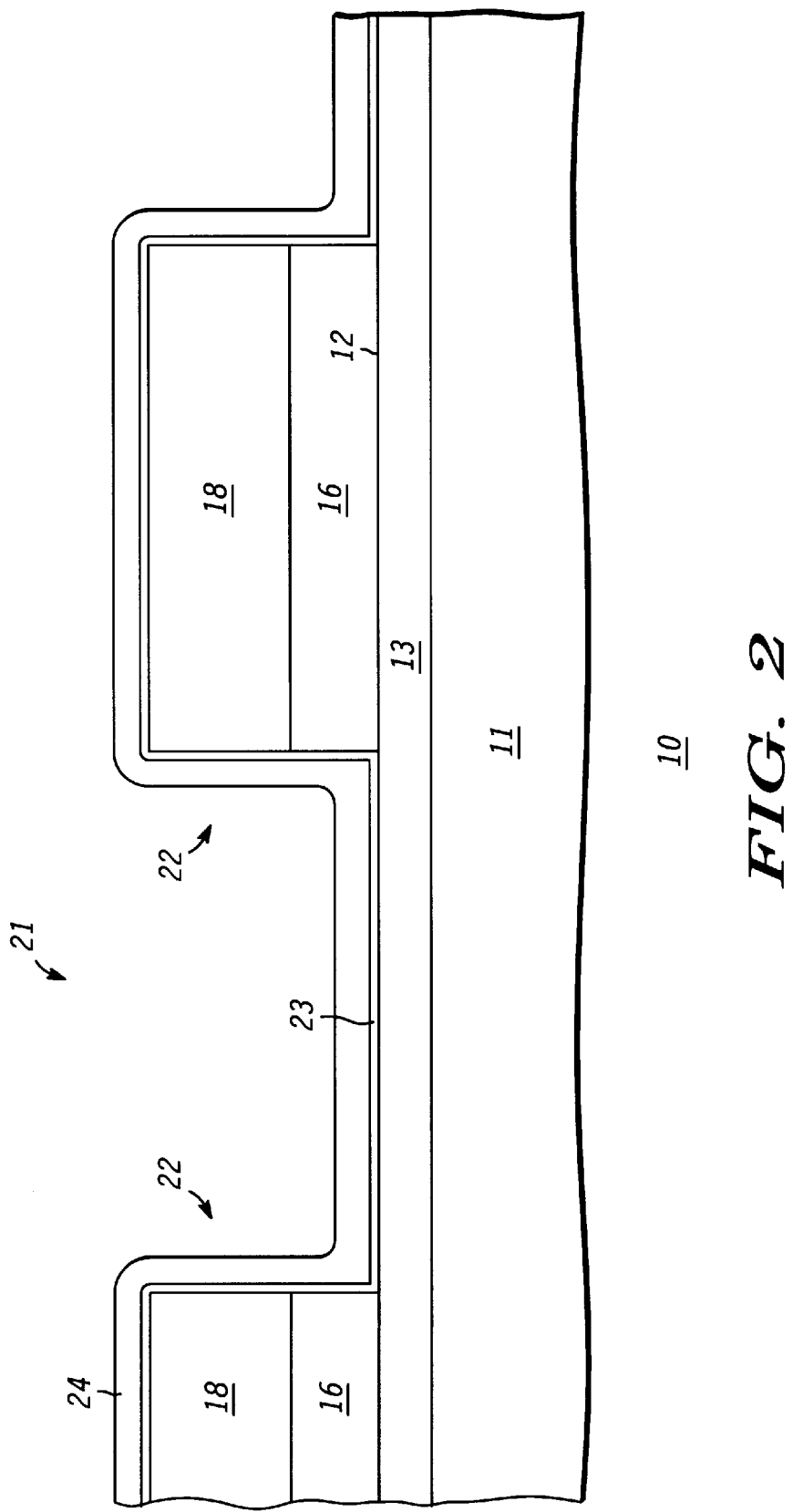

Now referring to FIG. 2, openings 21 having sidewalls 22 are formed through layers 18 and 16 to expose a portion of major surface 12. In other words, layers 16 and 18 are patterned to form a dielectric stack. Techniques for forming openings 21 are well known to those skilled in the art. It should be understood that the same reference numbers are used in the figures to denote the same elements. Although openings 21 are shown and described as extending through layer 16, it should be understood that openings 21 may not extend completely through layer 16 but only partially through layer 16. A layer 23 of dielectric material is formed on the exposed portion of major surface 12. Layer 23 serves as a gate dielectric layer and comprises, for example, an oxide. By way of example, layer 23 is formed by a thermal oxidation technique. Other suitable materials for layer 23 include oxynitride, nitrided oxide (NO or $N_2O$), and the like.

When semiconductor structure 10 is used in lower voltage applications, (i.e., less than approximately 5.5 volts) layer 23 has a thickness ranging, for example, from approximately 5 nm to approximately 15 nm. When semiconductor structure 10 is used in higher voltage applications, (i.e., higher than approximately 5.5 volts) layer 23 has a thickness ranging from approximately 15 nm to approximately 70 nm.

Optionally, a layer 24 of polysilicon or amorphous silicon is formed on gate dielectric layer 23 using, for example, a chemical vapor deposition technique. Layer 24 is used in embodiments where it is desirable for the channel region to have a graded doping profile. Such devices are referred to as graded channel devices. More particularly, the thickness of layer 24 is used to control the lateral distribution of the channel region dopants rather than thermally controlling the distribution of the dopants. Thus, the accurate control of the graded channel doping using layer 24 helps to minimize transient enhanced diffusion effects (TED effects) due to ion implantation damage. Layer 24 also serves to protect gate oxide layer 23. By way of example, the thickness of layer 24 ranges between approximately 20 nm and approximately 100 nm. It should be understood that when a uniformly doped channel is desired, layer 24 is not included.

Figure 3:
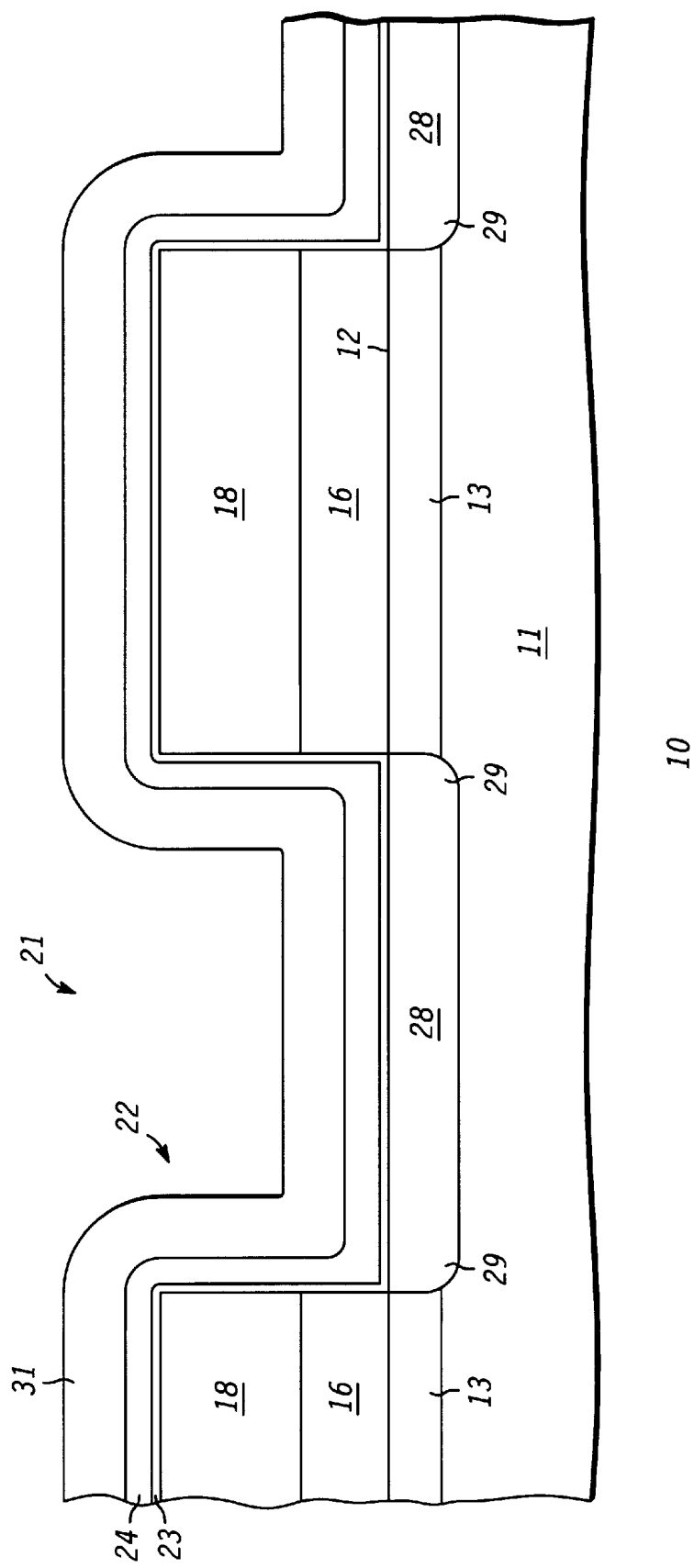

Referring now to FIG. 3, a P type dopant is implanted through layers 24 and 23, and into portions of semiconductor substrate 11 underlying openings 21. Thus, the P type dopant forms P type doped regions 28 in the portions of semiconductor substrate 11 underlying openings 21. In addition, the P type dopant forms graded channel regions 29 in portions of regions 28 adjacent to sidewalls 22. As described with reference to FIG. 2, layer 24 controls the profile of graded channel region 29. By way of example, doped regions 28 and channel regions 29 are formed by implanting a P type dopant such as, for example, boron, into semiconductor substrate 11. A suitable set of implant parameters includes implanting the boron at a dose ranging between approximately $1\times10^{12}$ ions per square centimeter (ions/cm$^2$) and $1\times10^{14}$ ions/cm$^2$ at an implant energy ranging between approximately 10 kilo-electron volts (keV) and 200 keV. Preferably the implant energy is 40 keV. It should be noted that doped regions 28 can be formed using multiple implants rather than a single implant. When using multiple implants, a first implant can be used to form graded channel regions 29 and a second implant can be used to reduce punch-through effects.

Still referring to FIG. 3, a layer of semiconductor material 31 such as, for example, polysilicon or amorphous silicon, is formed on layer 24 using techniques known to those skilled in the art. By way of example, polysilicon layer 31 is formed using a chemical vapor deposition technique and has a thickness of approximately 200 nm.

Figure 4:
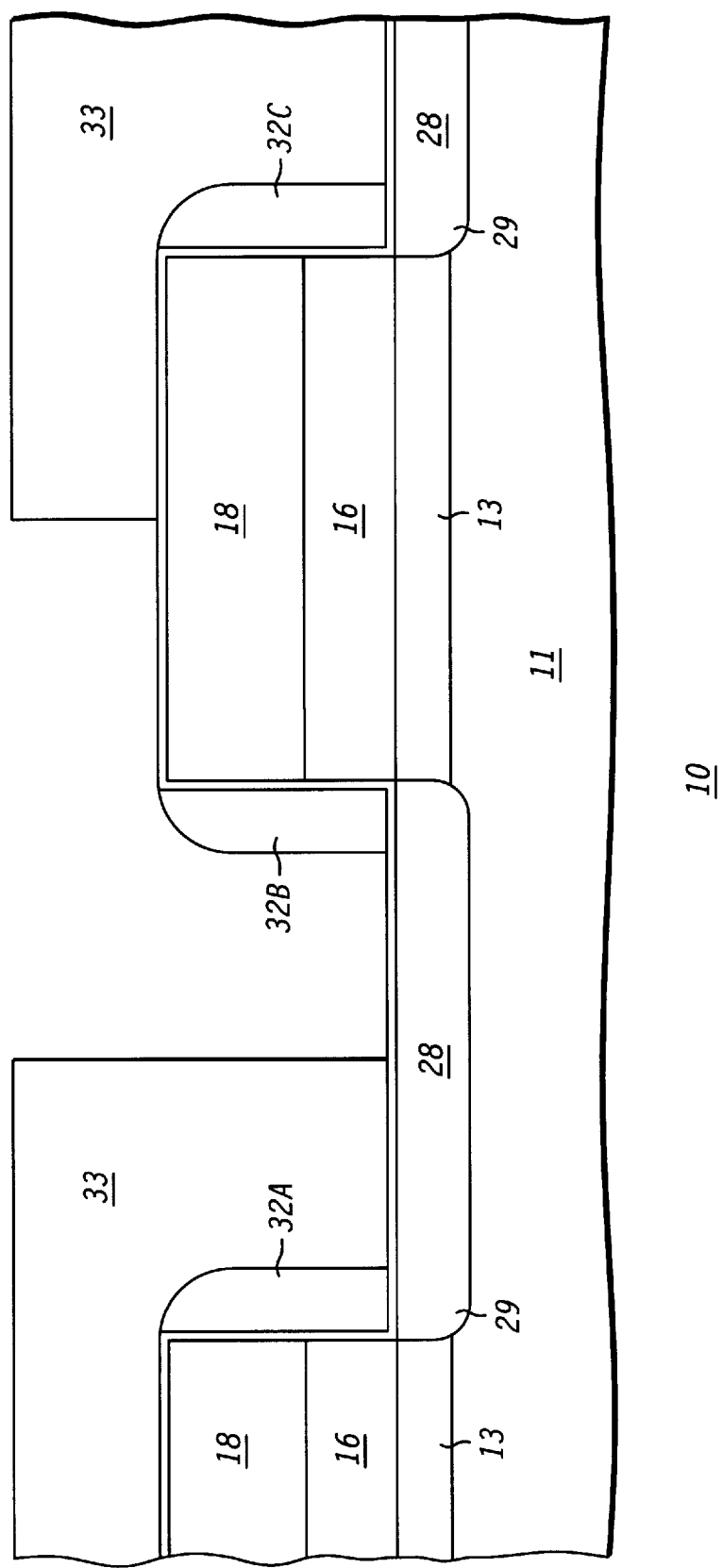

Now referring to FIG. 4, layers 31 and 24 (shown in FIG. 3) are anisotropically etched to form conductive spacers 32A, 32B, and 32C. It should be noted that conductive spacers 32A, 32B, and 32C are formed by the remaining portions of layers 31 and 24. It should be further noted that the exposed portions of gate dielectric layer 23 are thinned during the formation of conductive spacers 32A, 32B, and 32C. The thicknesses of layers 31 and 24 control the widths of conductive spacers 32A, 32B, and 32C, which in turn control the effective channel length of field effect transistors formed from semiconductor structure 10. A layer 33 of photoresist is formed on layers 18 and 23 and on conductive spacers 32A and 32C, exposing conductive spacer 32B.

Figure 5:
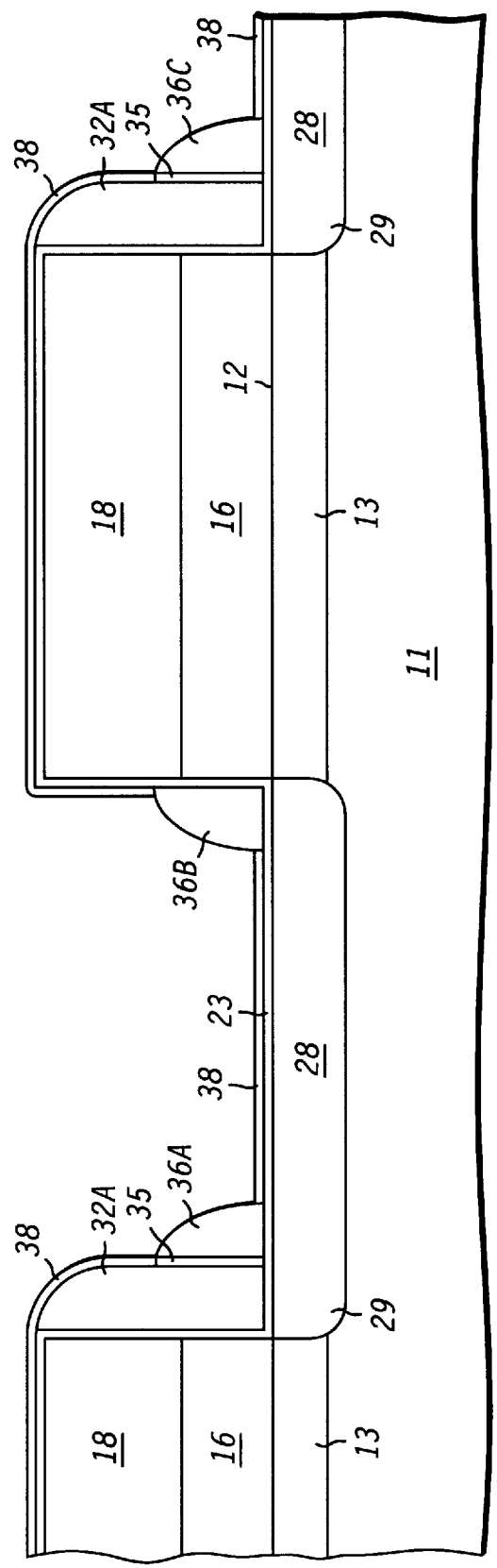

Now referring to FIG. 5, conductive spacer 32B is removed using techniques known to those skilled in the art. After removing conductive spacer 32B, layer 33 of photoresist is removed. An oxide layer 35 having a thickness ranging from approximately 3 nm to approximately 10 nm is formed on conductive spacers 32A and 32C. A layer of dielectric material (not shown) is formed on oxide layer 35 and portions of layers 16, 18, and 23. By way of example, the layer (not shown) of dielectric material is comprised of an oxide that may be formed by the decomposition of tetraethyl orthosilicate and has a thickness ranging between approximately 100 nm and approximately 200 nm. An oxide layer formed by decomposition of tetraethyl orthosilicate is typically referred to as a layer of TEOS or a TEOS layer.

The layer of dielectric material is anisotropically etched to form spacers 36A, 36B, and 36C. The etch step removes portions of gate dielectric 23 adjacent spacers 36A, 36B, and 36C and portions of layer 35. An oxide layer 38 is formed over the exposed portions of conductive spacers 32A and 32C and major surface 12. It should be noted that oxide layer 38 and layer 35 are formed during different process steps. More particularly, the portions of the dielectric material above spacers 36A and 36C and lining conductive spacers 32A and 32C result from the formation of oxide layer 38, whereas the portions of the dielectric material laterally adjacent to spacers 36A and 36C and lining conductive spacers 32A and 32C result from the formation of layer 35.

Figure 6:
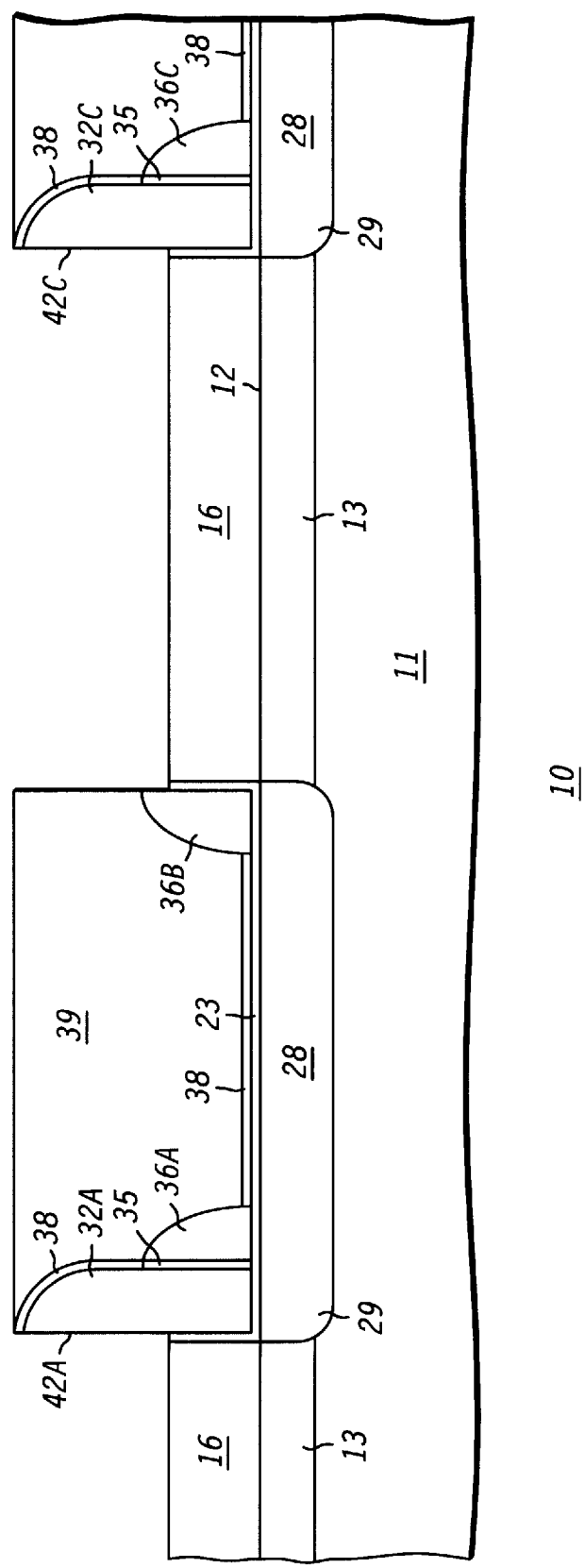
FIGS. 6–9 are cross-sectional views illustrating insulated gate semiconductor devices during manufacture in accordance with a first embodiment of the present invention.

Now referring to FIG. 6, a continuous layer of material is formed over substrate 11 and planarized using conventional techniques to fill openings 21. Subsequently, layer 18 is removed using techniques known to those skilled in the art thereby exposing portions 42A and 42C of the vertical sides of conductive spacer 32A and 32C, respectively. It should be noted that the planarization of the continuous layer of material and the removal of layer 18 leaves a portion 39 of the continuous layer. Portion 39 masks sloped portions 42A and 42C of conductive spacers 32A and 32C, respectively, and spacers 36A, 36B, and 36C.

Figure 7:
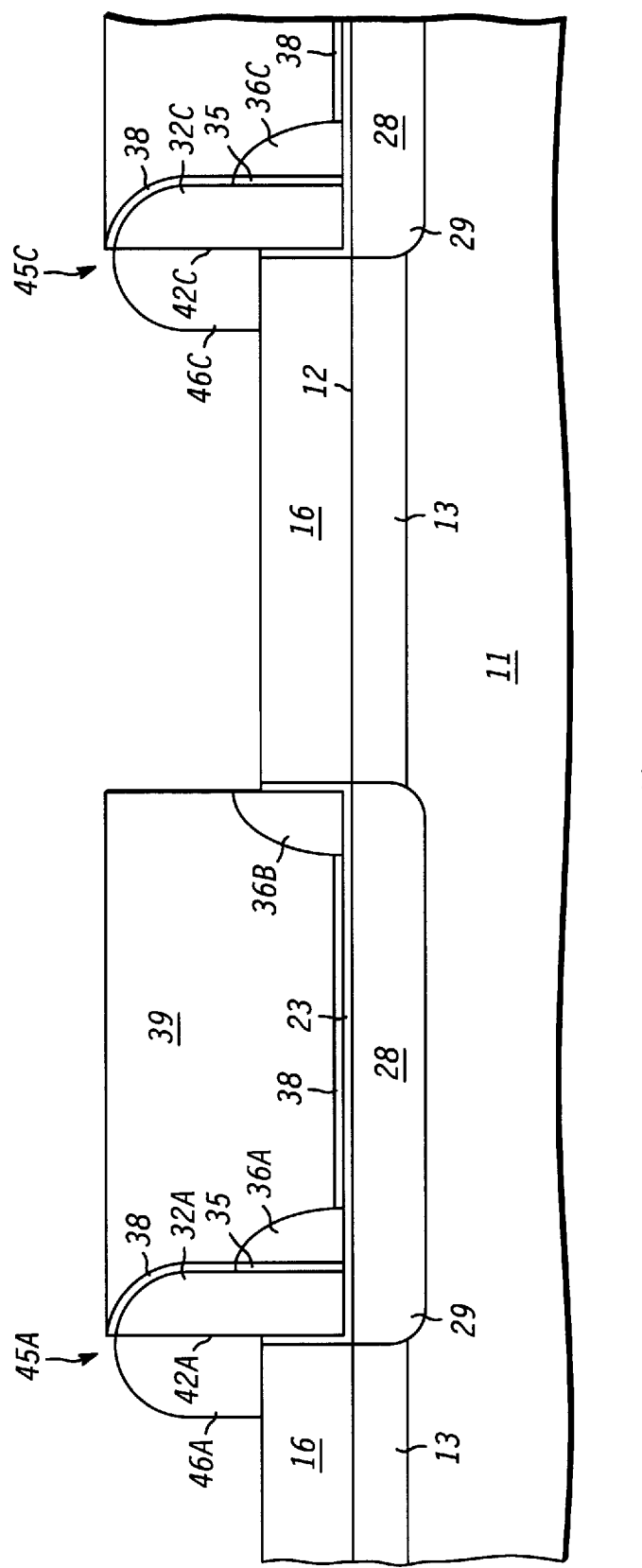

Now referring to FIG. 7, conductive spacer extensions 46A and 46C are formed adjacent to vertical sidewalls 42A and 42C of conductive spacers 32A and 32C, respectively. Conductive spacer extensions 46A and 46C are also referred to as gate extensions and extension regions. In one embodiment, extensions 46A and 46C are formed by selective growth of semiconductor material such as, for example, silicon, using exposed portions 42A and 42C as seed regions. Extensions 46A and 46C extend laterally from exposed portions 42A and 42C along layer 16. Extensions 46A and 46C, in combination with conductive spacers 32A and 32C, respectively, form gate structures 45A and 45C. In this embodiment, the length of extensions 46A and 46C is determined by the amount of time over which the selective silicon growth occurs. In other words, the longer extensions can be formed by using a longer selective silicon growth time. This technique is preferably used when short extensions are desired. Alternatively, the polysilicon can be deposited rather than selectively grown.

Figure 8:
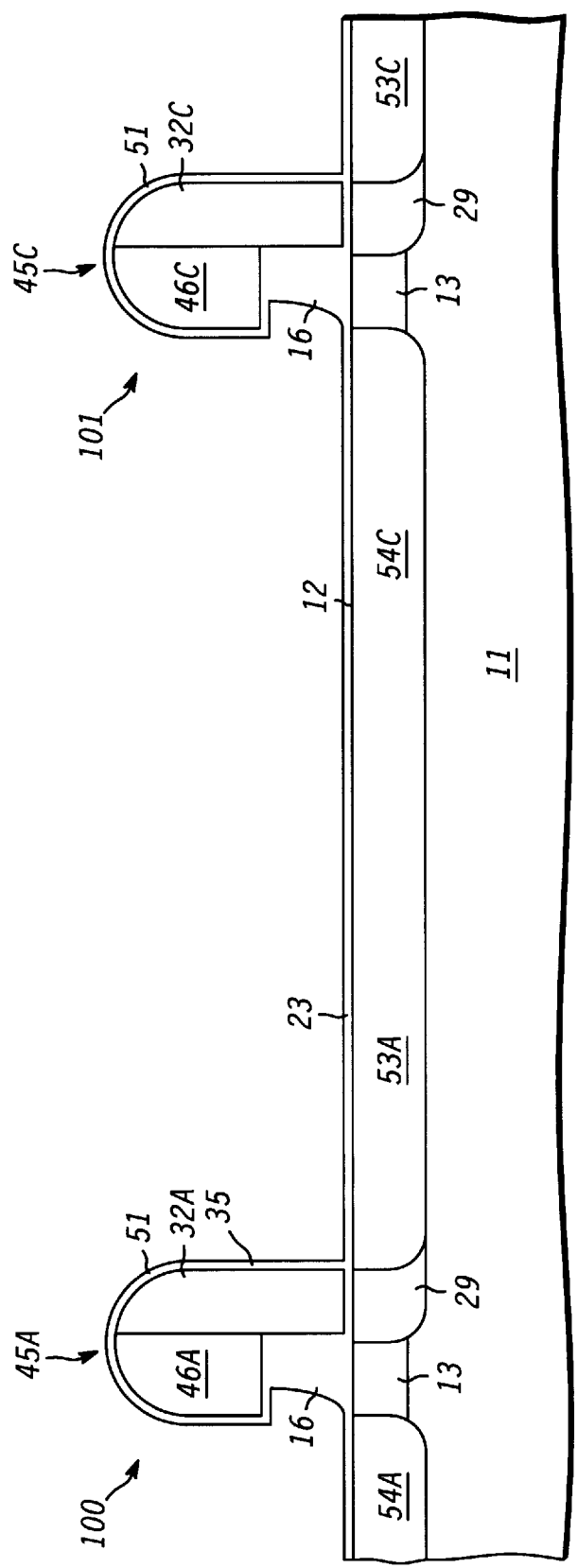

Now referring to FIG. 8, a portion of layer 16, layers 35 and 38, spacers 36A, 36B, and 36C, and portion 39 are removed using techniques well known to those skilled in the art. Because the material of layers 16 and 38 are formed by thermal oxidation, and spacers 36A, 36B, and 36C are formed by densification of TEOS followed by thermal oxidation, they are harder to etch than the material of portion 39, which is undensified TEOS. The difference in the etch rates is used to more accurately control the undercut of layer 16 and to protect layer 23 from being overetched. Overetching layer 23 is undesirable because it introduces process variations in the gate oxide thickness, effective channel length, and gate oxide integrity, among other things.

A layer 51 of dielectric material such as, for example, thermally grown oxide, or deposited TEOS, is formed over substrate 11 and gate structures 45A and 45C. By way of example, layer 51 has a thickness ranging between approximately 10 nm and approximately 30 nm. A source/drain implant is performed to form source regions 53A and 53C and drain regions 54A and 54C. In addition, the source/drain implant dopes gate structures 45A and 45C. A suitable set of implant parameters for the source/drain implant includes implanting an N type dopant such as, for example, arsenic, at a dose ranging from approximately $5\times10^{13}$ atoms/cm$^2$ to approximately $8\times10^{15}$ atoms/cm$^2$ and an energy ranging from approximately 20 to approximately 90 keV for a single implant. Alternatively, a multiple implant process can be used. In accordance with the present invention, source regions 53A and 53C, and drain regions 54A and 54C are self-aligned to gate structures 45A and 45C, respectively. Because channel regions 29 under spacers 32A and 32C have dimensions that are smaller than can be achieved using conventional photolithography, the effective channel lengths of semiconductor devices 100 and 101 are much smaller than can achieved using conventional photolithography.

Figure 9:
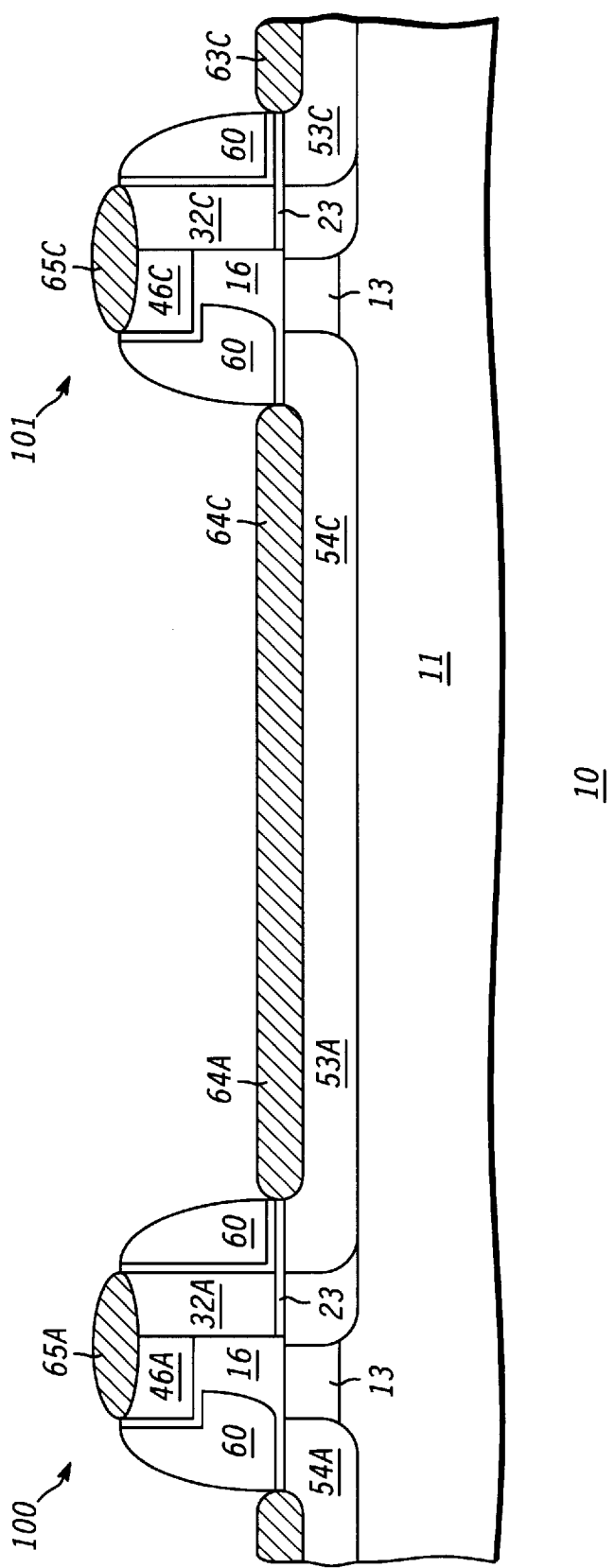

Referring now to FIG. 9, a thermal activation is performed, preferably using rapid thermal annealing (RTA) at a temperature ranging from approximately 1000 degrees Celsius (°C.) to approximately 1100° C. for a period of approximately 20 seconds to approximately 120 seconds. A nitride layer is deposited over the gate structures 45A and 45C, source regions 53A and 53C, and drain regions 54A and 54C. The nitride layer is subsequently etched to form nitride spacers 60. A silicide pre-clean is performed to remove dielectric layer 51 to expose the source regions 53A and 53C, drain regions 54A and 54C, and gate structures 45A and 45C. A silicide is formed in the source regions 53A and 53C, drain regions 54A and 54C, and gate structures 45A and 45C using conventional silicidation techniques. The silicide forms source contacts 63A and 63C, drain contacts 64A and 64C, and gate contacts 65A and 65C.

Figure 10:
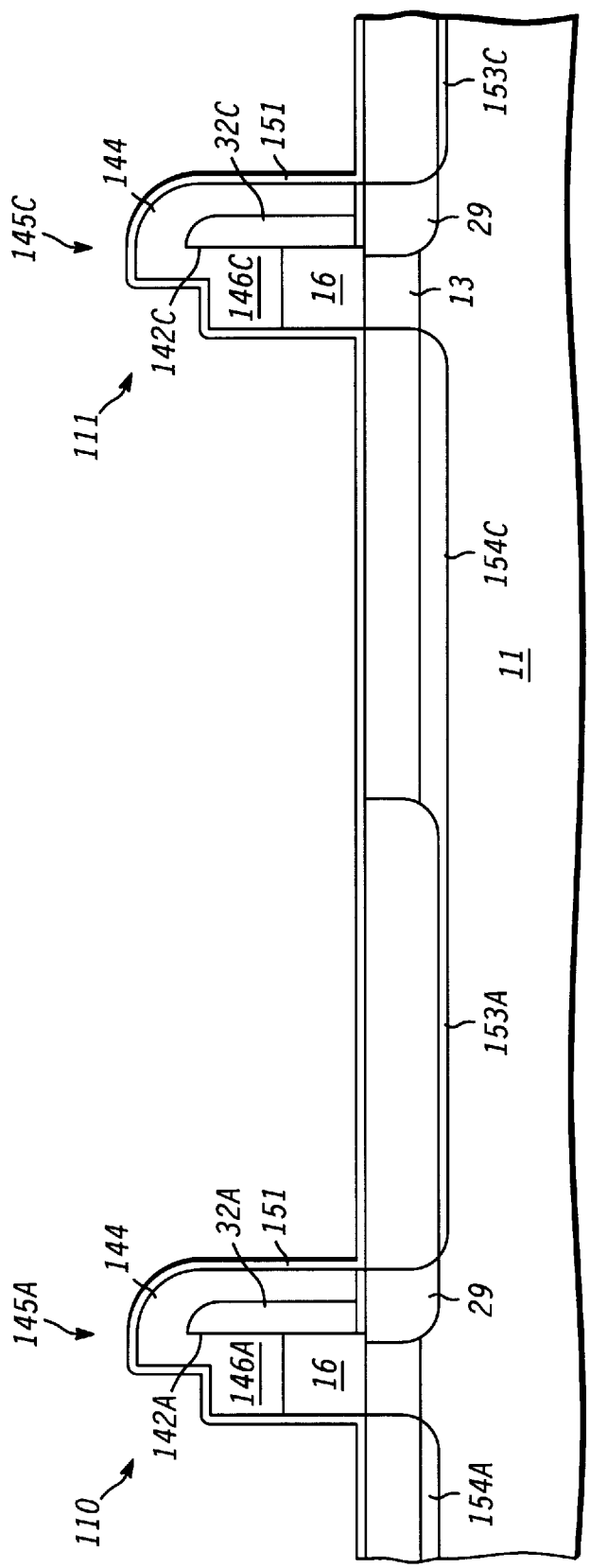
FIGS. 10–11 are cross-sectional views illustrating insulated gate semiconductor devices during manufacture in accordance with a second embodiment of the present invention.
Figure 11:
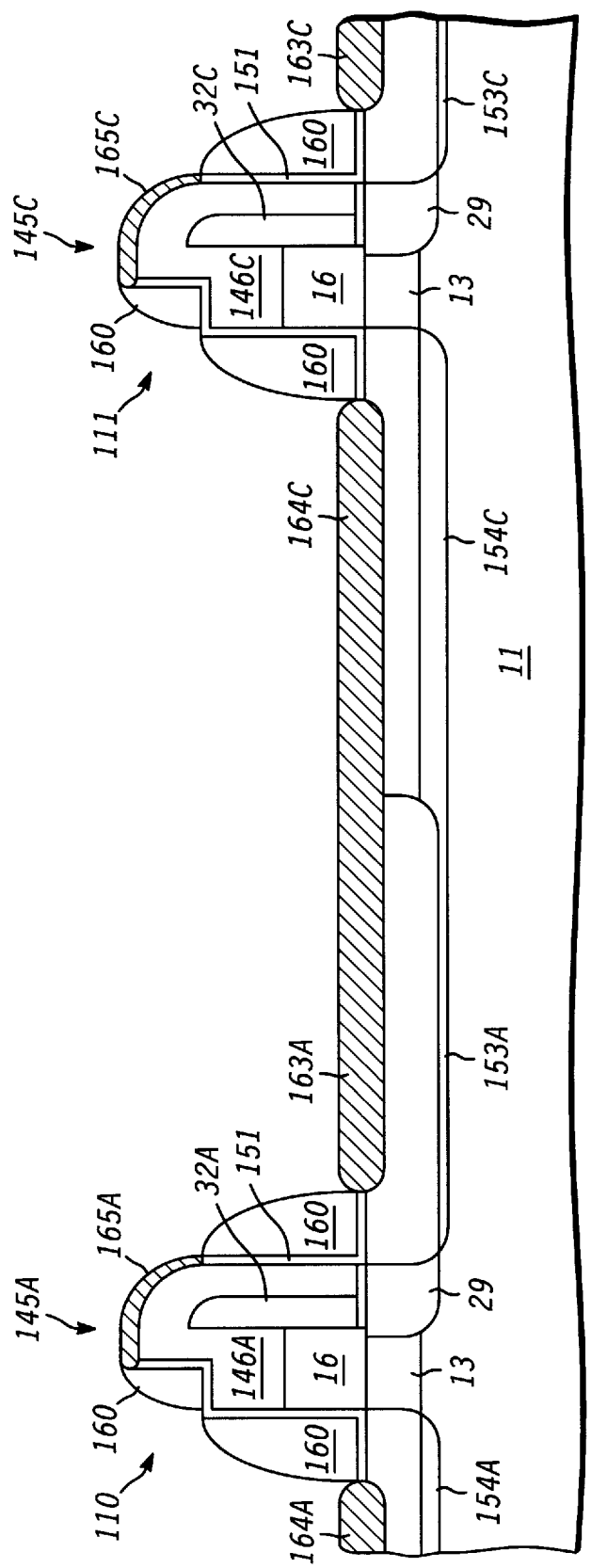

FIGS. 10–11 are cross-sectional views illustrating insulated gate semiconductor devices 110 and 111 during processing. It should be understood that FIGS. 1–5 are common to the embodiments described with reference to FIGS. 1–9 and FIGS. 10–11.

Now referring to FIG. 10, layer 18 is removed using techniques known to those skilled in the art thereby exposing portions 142A and 142C of the vertical sides of conductive spacer 32A and 32C, respectively. Gate extensions or extension regions 146A and 146C are formed adjacent to vertical sidewalls 142A and 142C of conductive spacers 32A and 32C, respectively. In this embodiment, a layer of polysilicon or amorphous silicon 144 is deposited on layer 16, conductive spacers 32A and 32C, and layer 38. Before polysilicon layer 144 is deposited, spacers 36A–C and portions of layers 16 and 38 are removed. Polysilicon layer 144 is patterned and etched to form extensions 146A and 146C using techniques known to those skilled in the art. Extensions 146A and 146C, in combination with conductive spacers 32A and 32C, respectively, form gate structures 145A and 145C. In this embodiment, the length of extensions 146A and 146C is determined by forming a mask (not shown) over the desired length of the extension. Then, the unmasked portions of the deposited polysilicon are removed using etch techniques known to those skilled in the art. An advantage of defining the length of the extension by using masking techniques is that the lengths can be made to be of different sizes for different semiconductor devices within a single semiconductor chip. Providing different size extension lengths is desirable for mixed mode and power applications.

A layer 151 of dielectric material such as, for example, thermally grown oxide, or deposited TEOS, is formed over substrate 11 and gate structures 145A and 145C. By way of example, layer 151 has a thickness ranging between approximately 10 nm and approximately 30 nm. A source/drain implant is performed to form source regions 153A and 153C and drain regions 154A and 154C. In addition, the source/drain implant dopes gate structures 145A and 145C. A suitable set of implant parameters for the source/drain implant includes implanting an N type dopant such as, for example, arsenic, at a dose ranging from approximately $5 \times 10^{13}$ atoms/cm$^2$ to approximately $8 \times 10^{15}$ atoms/cm$^2$ and an energy ranging from approximately 20 to approximately 90 keV for a single implant. Alternatively, a multiple implant process can be used. In accordance with the present invention, source regions 153A and 153C, and drain regions 154A and 154C are self-aligned to gate structures 145A and 145C, respectively. Because channel regions 29 under spacers 32A and 32C have dimensions that are smaller than can be achieved using conventional photolithography, the effective channel lengths of semiconductor devices 110 and 111 are much smaller than can be achieved using conventional photolithography.

Referring now to FIG. 11, a thermal activation is performed, preferably using rapid thermal annealing (RTA) at a temperature ranging from approximately 1000° C. to approximately 1100° C. for a period of approximately 20 seconds to approximately 120 seconds. A nitride layer is deposited over the gate structures 145A and 145C, source regions 153A and 153C, and drain regions 154A and 154C. The nitride layer is subsequently etched to form nitride spacers 160. A silicide pre-clean is performed to remove dielectric layer 151 to expose the source regions 153A and 153C, drain regions 154A and 154C, and gate structures 145A and 145C. A silicide is formed in the source regions 153A and 153C, drain regions 154A and 154C, and gate structures 145A and 145C using conventional silicidation techniques. The silicide forms source contacts 163A and 163C, drain contacts 164A and 164C, and gate contacts 165A and 165C.

By now it should be appreciated that an insulated gate semiconductor device and a method for manufacturing the device that overcome the problems and limitations of the prior art have been provided. Using the method of the present invention, an insulated gate semiconductor device that can be accurately and reproducibly manufactured. Furthermore, the present invention provides a cost effective manufacturing process that is compatible with standard techniques used in the current fabrication processes.

It should be understood that the materials, concentrations, and thicknesses provided in the description of the present invention merely serve as examples and are not limitations of the present invention. Although the present invention describes the formation of an N-channel insulated gate semiconductor device, this is not a limitation of the present invention. For example, the present invention is also suitable for forming P-channel insulated gate field effect semiconductor devices, complementary insulated gate semiconductor devices, or the like.

We claim:

1. A method for manufacturing an insulated gate semiconductor device having a spacer extension, comprising the steps of:

providing a semiconductor substrate of a first conductivity type and having a major surface;

forming a first dielectric layer over the major surface;

forming a second dielectric layer over the first dielectric layer;

forming an opening through the second dielectric layer and into the first dielectric layer;

forming a rate dielectric layer within the opening;

forming a conductive spacer within the opening;

filling the opening with a third dielectric layer;

removing exposed portions of the second dielectric layer to expose a portion of the conductive spacer;

forming a conductive spacer extension over the first dielectric layer, wherein the conductive spacer extension is coupled to the exposed portion of the conductive spacer to form gate structure; and forming first and second doped regions aligned to the gate structure, wherein the first and second doped regions are of a second conductivity type.

2. The method of claim 1 wherein the step of forming the conductive spacer extension includes selectively growing the conductive spacer extension on the exposed portion of the conductive spacer and over the first dielectric layer.

3. The method of claim 2 further comprising the step of removing a portion of the conductive spacer extension to set an extension length.

4. The method of claim 1 wherein the step of forming the conductive spacer extension includes the steps of:

depositing a layer of semiconductor material over the semiconductor substrate; and removing a portion of the layer of semiconductor material.

5. The method of claim 4 wherein the step of removing portions of the semiconductor material includes the steps of:

forming a patterned protective layer over the layer of semiconductor material leaving a portion of the layer of semiconductor material exposed; and etching the exposed portion of the layer of semiconductor material.

6. The method of claim 1 wherein the step of forming the conductive spacer includes forming the conductive spacer comprising one of polycrystalline silicon and amorphous silicon.

7. The method of claim 1, further including the step of doping the semiconductor substrate with a dopant of the second conductivity type.

8. The method of claim 1, further including the step of doping a portion of the semiconductor substrate with a dopant of the first conductivity type, wherein the portion of the semiconductor substrate is below a portion of the conductive spacer.

9. The method of claim 1, wherein the step of forming the conductive layer comprises the steps of:

forming a first silicon layer over the second dielectric layer and within the opening; and forming a second silicon layer over the first silicon layer.

10. The method of claim 9, further comprising the step of forming a third doped region in the semiconductor substrate through the opening before the step of forming the second silicon layer, wherein the third doped region is of the first conductivity type.

11. A process for forming an insulated gate semiconductor device comprising the steps of:

forming a dielectric stack over a major surface of a body of semiconductor material, wherein the dielectric stack has a sidewall, and wherein the dielectric stack comprises a first dielectric layer over the major surface and a second dielectric layer formed over the first dielectric layer, and wherein the body of semiconductor material has a first conductivity type;

forming a gate dielectric layer over the major surface adjacent to the dielectric stack;

forming a first spacer adjacent to the sidewall and over the gate dielectric layer;

removing a portion of the second dielectric layer to expose a portion of the first spacer;

forming an extension region over the first dielectric layer and adjacent the exposed portion of the first spacer;

removing portions of the first dielectric layer adjacent to the extension region; and doping portions of the body of semiconductor material with a second conductivity type dopant to form first and second doped regions aligned to the first spacer and the extension region.

12. The process of claim 11 further comprising the steps of:

forming a continuous layer of material over the body of semiconductor material after the step of forming the first spacer; and planarizing the continuous layer of material before the step of removing the portion of the second dielectric layer.

13. The process of claim 12 further comprising the step of forming a second spacer over the gate dielectric layer and adjacent the first spacer before the step of forming the continuous layer.

14. The process of claim 11 wherein the step of forming the extension region includes selectively growing a silicon region.

15. The process of claim 11 wherein the step of forming the first spacer includes forming the first spacer comprising one of polycrystalline silicon and amorphous silicon.

* * * * *